United States Patent
Lauer et al.

(10) Patent No.: US 9,793,398 B1
(45) Date of Patent: Oct. 17, 2017

(54) FABRICATION OF A STRAINED REGION ON A SUBSTRATE

(71) Applicant: INTERNATIONAL BUSINESS MACHINES CORPORATION, Armonk, NY (US)

(72) Inventors: Isaac Lauer, Yorktown Heights, NY (US); Jiaxing Liu, New York, NY (US); Renee T. Mo, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/226,834

(22) Filed: Aug. 2, 2016

(51) Int. Cl.
H01L 21/335 (2006.01)
H01L 29/78 (2006.01)
H01L 21/3065 (2006.01)
H01L 21/02 (2006.01)
H01L 29/10 (2006.01)
H01L 21/324 (2006.01)
H01L 21/306 (2006.01)
H01L 29/66 (2006.01)

(52) U.S. Cl.
CPC ...... H01L 29/7843 (2013.01); H01L 21/0217 (2013.01); H01L 21/0245 (2013.01); H01L 21/02428 (2013.01); H01L 21/02433 (2013.01); H01L 21/02532 (2013.01); H01L 21/02598 (2013.01); H01L 21/3065 (2013.01); H01L 21/30604 (2013.01); H01L 21/324 (2013.01); H01L 29/1033 (2013.01); H01L 29/66568 (2013.01)

(58) Field of Classification Search
CPC ............ H01L 21/02598; H01L 21/845; H01L 21/66818
USPC .......................................... 257/213; 438/142
See application file for complete search history.

(56) References Cited

U.S. PATENT DOCUMENTS

| | | | |
|---|---|---|---|
| 7,060,585 B1 | 6/2006 | Cohen et al. | |
| 7,238,589 B2 | 7/2007 | Cohen et al. | |
| 7,482,190 B2 | 1/2009 | Forbes | |
| 7,700,416 B1 * | 4/2010 | Clifton | H01L 21/84 257/190 |

(Continued)

OTHER PUBLICATIONS

Mooney, et al., "Elastic Strain Relaxation in Free-standing SiGe/Si Structures", Applied Physics Letters, Feb. 2004, pp. 1093-1095, Volue 84, No. 7.

*Primary Examiner* — David Vu
*Assistant Examiner* — Brandon Fox
(74) *Attorney, Agent, or Firm* — Tutunjian & Bitetto, P.C.; Vazken Alexanian

(57) ABSTRACT

A method of forming a strained channel for a field effect transistor, including forming a sacrificial layer on a substrate, forming a channel layer on the sacrificial layer, forming a stressor layer on the channel layer, wherein the stressor layer applies a stress to the channel layer, forming at least one etching trench by removing at least a portion of the stressor layer, channel layer, and sacrificial layer, wherein the etching trench exposes at least a portion of a sidewall of the sacrificial layer, and separates the stressor layer, channel layer, and sacrificial layer into two or more stressor islands, channel blocks, and sacrificial slabs, and removing the sacrificial slabs to release the channel blocks from the substrate using a selective etch, wherein the channel blocks adhere to the substrate surface.

19 Claims, 7 Drawing Sheets

(56) References Cited

U.S. PATENT DOCUMENTS

| | | | |
|---|---|---|---|
| 7,851,325 B1* | 12/2010 | Gaines | H01L 21/76224 |
| | | | 257/E27.147 |
| 7,973,336 B2 | 7/2011 | Savage et al. | |
| 8,952,420 B1 | 2/2015 | Loubet et al. | |
| 8,962,447 B2 | 2/2015 | Forbes | |
| 2006/0134893 A1* | 6/2006 | Savage | H01L 21/6835 |
| | | | 438/483 |
| 2008/0061798 A1* | 3/2008 | Blick | B82Y 35/00 |
| | | | 324/642 |
| 2009/0289284 A1 | 11/2009 | Goh et al. | |
| 2011/0140170 A1* | 6/2011 | Dove | H01L 21/84 |
| | | | 257/192 |
| 2011/0291100 A1 | 12/2011 | Cheng et al. | |

* cited by examiner

FABRICATION OF A STRAINED REGION ON A SUBSTRATE

BACKGROUND

Technical Field

The present invention generally relates to the formation of a strained region on a substrate, and more particularly to the fabrication of a strained channel region for a planar metal-oxide-semiconductor field effect transistor (MOSFET) or fin field effect transistor (finFET).

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab, commonly referred to as the fin, with a gate on the fin, as compared to a MOSFET with a gate parallel with the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS) devices, where a p-channel MOSFET or finFET and n-channel MOSFET or finFET are coupled together.

SUMMARY

In accordance with an embodiment of the present principles, a method is provided of forming a strained channel for a field effect transistor. The method includes the steps of forming a sacrificial layer on a substrate, and forming a channel layer on the sacrificial layer. The method further includes the steps of forming a stressor layer on the channel layer, wherein the stressor layer applies a stress to the channel layer, and forming at least one etching trench by removing at least a portion of the stressor layer, channel layer, and sacrificial layer, wherein the etching trench exposes at least a portion of a sidewall of the sacrificial layer, and separates the stressor layer, channel layer, and sacrificial layer into two or more stressor islands, channel blocks, and sacrificial slabs. The method further includes the step of removing the sacrificial slabs to release the channel blocks from the substrate using a selective etch, wherein the channel blocks adhere to the substrate surface.

In accordance with an embodiment of the present principles, a method is provided of forming a strained channel. The method includes the step of forming a single crystal silicon-germanium sacrificial layer on a single crystal substrate surface. The method further includes the steps of forming a single crystal silicon channel layer on the single crystal silicon-germanium sacrificial layer, and forming a silicon nitride stressor layer on the single crystal silicon channel layer, wherein the silicon nitride stressor layer has a tensile or compressive stress. The method further includes the step of forming at least one etching trench by removing at least a portion of the silicon nitride stressor layer, single crystal silicon channel layer, and single crystal silicon-germanium sacrificial layer, wherein the etching trench exposes at least a portion of a sidewall of the single crystal silicon-germanium sacrificial layer, and separates the silicon nitride stressor layer, single crystal silicon channel layer, and single crystal silicon-germanium sacrificial layer into two or more silicon nitride stressor islands, single crystal silicon channel blocks, and single crystal silicon-germanium sacrificial slabs. The method further includes the step of removing the single crystal silicon-germanium sacrificial slabs to release the single crystal silicon channel blocks from the substrate using a selective etch, wherein the single crystal silicon channel blocks adhere to the single crystal substrate surface.

In accordance with another embodiment of the present principles, an intermediate channel structure is provided. The intermediate channel structure includes a substrate with a single crystal surface. The intermediate channel structure further includes one or more silicon-germanium pillars, where each of the one or more silicon-germanium pillars supports a silicon channel block, and a silicon nitride stressor island on each silicon channel block, wherein the stressor island applies a stress to a top surface of the silicon channel block.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
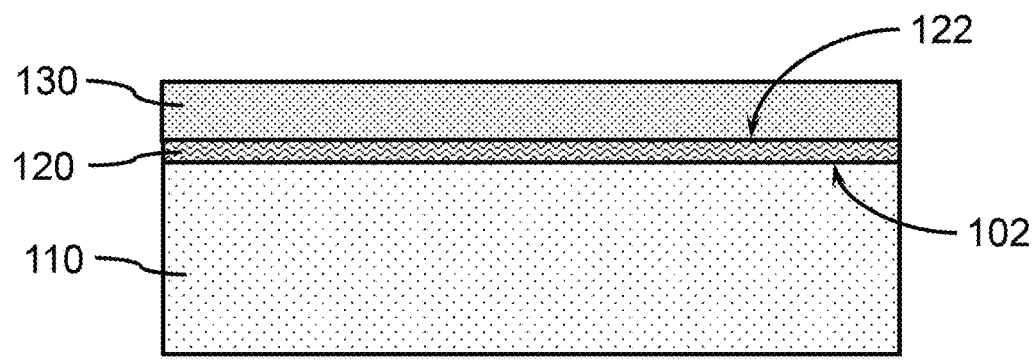
FIG. 1 is a cross-sectional side view showing a substrate with additional layers, in accordance with the present principles.

Principles and embodiments of the present disclosure relate generally to the fabrication of metal-oxide-semiconductor field effect transistor (MOSFET) and fin field effect transistor (finFET) devices with a strained channel region. The formation of the strained channel region may involve temporarily separating a semiconductor layer (also referred to herein as a channel layer) from the underlying substrate and then rebonding the strained semiconductor layer to the substrate surface. A strain may be imparted to the semiconductor layer (i.e., channel layer) by a stressor layer when the semiconductor layer becomes separated from the underlying substrate.

In various embodiments, the semiconductor layer may be formed on a sacrificial layer on the substrate that can be selectively removed, thereby allowing the semiconductor layer to become strained and reattached to the surface of the substrate through hydrophobic attraction in the strained state. The strained semiconductor layer may then be utilized as a channel in one or more field effect transistors (FETs), where portions of the strained semiconductor layer (e.g., channel blocks) may be separated into a plurality of channels. The number of strained channels may depend on the dimensions of the silicon channel blocks and the dimensions of the intended channels.

Principles and embodiments of the present disclosure relate to inducing stress into the semiconductor layer (i.e., channel layer) from a stressor layer formed on an exposed surface of the semiconductor layer, where the stressor layer may impart a tensile or compressive stress to the semiconductor layer to create a strained semiconductor layer. The strained semiconductor layer may be used to form one or more strained channels.

Principles and embodiments of the present disclosure also relates to the formation of a plurality of silicon channel blocks on a substrate, where each channel block may be a strained semiconductor that can be patterned and etched to form one or more strained channels for MOSFET and/or finFET devices. The formation of the strained channel blocks and MOSFET and/or finFET devices does not consume a SeOI wafer, since the layers are add to the substrate by epitaxial growth.

Principles and embodiments of the present disclosure also relate to using a sacrificial layer that can be epitaxially grown on the substrate and which preserves the crystal structure for epitaxial formation of the channel layer, but can be preferentially etched in relation to the material of the channel layer and substrate.

Exemplary applications/uses to which the present principles can be applied include, but are not limited to: (NAND gates, NOR gates, XOR gates, static random access memory (SRAM), inverters, etc.).

It is to be understood that the present invention will be described in terms of a given illustrative architecture; however, other architectures, structures, substrate materials and process features and steps may be varied within the scope of the present invention.

Referring now to the drawings in which like numerals represent the same or similar elements and initially to FIG. 1, which is a cross-sectional side view showing a substrate with additional layers, in accordance with the present principles.

In one or more embodiments, a substrate 110 may be a semiconductor or an insulator with an active surface semiconductor layer. The substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, aluminum oxide ($Al_2O_3$), silicon dioxide ($SiO_2$), gallium arsenide (GaAs), indium phosphide (InP), silicon carbide (SiC), or silicon germanium (SiGe). The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer or a silicon-germanium wafer. In an embodiment, the substrate may be a single crystal silicon (Si) or silicon germanium (SiGe) wafer, or have a single crystal silicon (Si) or silicon germanium (SiGe) surface/active layer.

In various embodiments, the surface of the wafer or active layer may be processed to form a thermal oxide and/or doped region. The surface may have a predetermined crystal orientation for epitaxial growth of subsequent layers. In one or more embodiments, a substrate 110 may be a single crystal silicon substrate.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

In one or more embodiments, a sacrificial layer 120 may be formed on the top surface 102 of the substrate 110. In various embodiments, the sacrificial layer 120 may be a silicon-germanium (SiGe) layer, where the silicon-germanium layer may be a single crystal silicon-germanium layer epitaxially grown on the substrate surface 102. In various embodiments, the sacrificial layer 120 may be a silicon (Si) layer, where the silicon layer may be a single crystal silicon layer epitaxially grown on the substrate surface 102. In various embodiments, a silicon-germanium sacrificial layer 120 may be epitaxially grown on one or more regions of a substrate 110, and a silicon sacrificial layer may be formed on different regions of the substrate 110. The substrate surface 102 may be a <100> crystal face of a single crystal silicon substrate, where a silicon or silicon germanium sacrificial layer 120 is grown in a (100) direction.

In one or more embodiments, different regions of a substrate 110 may be masked during selective formation of silicon-germanium sacrificial layer(s) 120 on predetermined regions of the substrate and formation of silicon sacrificial layer(s) 120 on different predetermined regions of the substrate 110. For formation of an NFET and a PFET to form a CMOS, the portion of the sacrificial layer(s) 120 forming the NFETs may be masked off during fabrication of the PFETs, whereas the sacrificial layer(s) 120 forming the PFETs may be masked off during fabrication of the NFETs. In various embodiments, each sacrificial layer 120 may be of sufficient size to form about 20 fins to about 100 fins, or about 20 fins to about 50 fins.

In one or more embodiments, the sacrificial layer 120 may be deposited by molecular beam epitaxy (MBE) or chemical vapor deposition epitaxy (CVD epitaxy), where the deposition may be a heteroepitaxial growth process. In a non-limiting example, a silicon-germanium sacrificial layer 120 may be deposited by MBE on the <100> surface 102 of a single crystal silicon wafer, where the SiGe sacrificial layer 120 has the same lattice constant as the underlying single crystal silicon, and the SiGe sacrificial layer is not a graded SiGe layer.

In various embodiments, the sacrificial layer 120 may have a thickness in the range of about 10 nm to about 100 nm, or in the range of about 10 nm to about 50 nm, or in the range of about 10 nm to about 25 nm, or in the range of about 15 nm to about 25 nm. The thickness of the sacrificial layer 120 may be less than a critical thickness at which dislocations appear at the sacrificial layer/substrate interface, where the dislocations may be misfit dislocations and threading dislocations. In various embodiments, a silicon-germanium sacrificial layer 120 may not be a grade silicon-germanium layer, where the silicon-germanium layer has a germanium concentration that does not vary with the distance from the interface of the silicon-germanium layer with the substrate surface 102.

In various embodiments, the silicon-germanium sacrificial layer 120 may be a graded silicon-germanium layer, where a graded silicon-germanium layer has a germanium concentration that varies with the distance from the interface of the grade silicon-germanium layer with the substrate surface 102. The germanium concentration may vary linearly with the distance from the interface, or step-wise. The germanium concentration may be in a range in which the etch rate over the whole range of Ge concentrations for a graded sacrificial layer 120 is sufficiently high that the sacrificial layer 120 is completely removed in a short enough period of time to avoid etching of the Si channel layer 130 and substrate 110 based on the relative etch rates of the etchant.

In one or more embodiments, a channel layer 130 may be formed on the sacrificial layer 120. In various embodiments, the channel layer 130 may be single crystal layer epitaxially grown on the surface of a single crystal sacrificial layer 120. The channel layer 130 may be doped in-situ as it is grown on the sacrificial layer 120, or ex-situ, for example by ion bombardment, after the channel layer 130 has been formed. The in-situ doping may preserve the crystallinity and crystallographic orientation of the single crystal channel layer 130, while avoiding damage induced by ion bombardment. Other suitable doping techniques may also be used, including but not limited to, gas phase doping, plasma doping, plasma immersion ion implantation, cluster doping, infusion doping, liquid phase doping, solid phase doping, or combinations thereof. In various embodiments, the channel layer 130 may be n-doped or p-doped to form an NFET or PFET. In an embodiment, the channel layer may be a single crystal silicon channel layer 130 doped in-situ as it is grown on a single crystal silicon-germanium sacrificial layer 120, or ex-situ, for example by ion bombardment, after the single crystal silicon channel layer 130 has been formed.

In one or more embodiments, the channel layer 130 may be deposited by molecular beam epitaxy (MBE) or chemical vapor deposition epitaxy (CVD epitaxy), where the deposition may be heteroepitaxy. In a non-limiting example, a single crystal silicon (Si) channel layer 130 may be deposited by MBE on the <100> surface 122 of silicon-germanium sacrificial layer 120, where the Si channel layer 130 has the same lattice constant as the underlying single crystal SiGe sacrificial layer 120. The Si channel layer 130 epitaxially deposited on the SiGe sacrificial layer 120, therefore, may not be strained by the SiGe lattice.

In various embodiments, the channel layer 130 may have a thickness in the range of about 5 nm to about 100 nm, in the range of about 20 nm to about 100 nm, or in the range of about 30 nm to about 80 nm, or in the range of about 40 nm to about 60 nm, or in the range of about 5 nm to about 60 nm, or in the range of about 60 nm to about 100 nm, although other thicknesses are contemplated. The channel layer 130 thickness may determine the height/depth of a channel subsequently formed for a field effect transistor (FET). In various embodiments, a thinner (e.g., 5 nm to 60 nm) channel layer may be used to form one or more planar channels for MOSFETs, whereas a thicker (e.g., 60 nm to 100 nm) channel layer may be used to form the vertical fins for finFETs.

Figure 2:
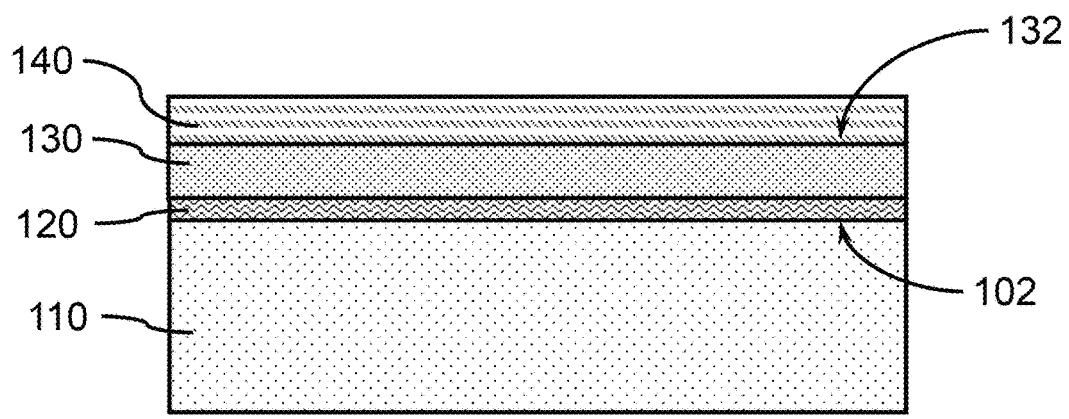
FIG. 2 is a cross-sectional side view showing a stressor layer on a channel layer, in accordance with the present principles.

FIG. 2 is a cross-sectional side view showing a stressor layer on a channel layer, in accordance with the present principles.

In one or more embodiments, a stressor layer 140 may be formed on the channel layer 130. The stressor layer 140 may be formed by CVD, PECVD, or PVD on the exposed surface 132 of the channel layer 130. In various embodiments, the stressor layer is not formed by an epitaxial growth process and is not a crystalline material. In various embodiments, the stressor layer 140 may be an amorphous silicon nitride (SiN), for example, $Si_3N_4$. The induced strain may not be a lattice-induced strain caused by a lattice mismatch. The induced strain may be generated by the process parameters used for formation of the amorphous stressor layer, where in various embodiments the stress may be due to grain boundaries with a high free energy.

In various embodiments, the temperature of formation of the stressor layer 140 may be varied to adjust the stress of the stressor layer 140, where the stress may be tensile or compressive. The stressor layer 140 may be formed at a temperature in the range of about 200° C. to about 500° C., or in the range of about 350° C. to about 500° C. for a PECVD process. The PECVD may be conducted at a pressure in the range of about 100 millitorr (mTorr) to about 1 torr (Torr) using a combination of gasses including silane ($SiH_4$), ammonia ($NH_3$), and nitrogen ($N_2$).

In various embodiments, the stoichiometry of the silicon nitride stressor layer may be adjusted to create a compressively or tensilely stressed stressor layer, where for example, a silicon-rich $Si_xN_y$ layer may impart a compressive strain, whereas a stoichiometric $Si_3N_4$ may impart a tensile strain.

In various embodiments, the stress induced in the stressor layer 140 may be in the range of about 1.6 GPa tensile stress to about 3 GPa compressive stress, where tensile stress is indicated by a positive stress value and compressive stress is indicated by a negative stress value (e.g., +1.6 GPa to −3 GPa).

In one or more embodiments, the thickness of the stressor layer 140 may be equal to or greater than the thickness of the channel layer 130, or the thickness of the stressor layer 140 may be greater than the thickness of the channel layer 130, where the ratio of the thicknesses of the stressor layer and channel layer can influence the amount of strain imparted to the channel layer 130. The thickness of the stressor layer 140 may be sufficient to generate a predetermined strain in a single crystal silicon channel layer 130. The predetermined strain in a single crystal silicon channel layer 130 may be about 0.5% to about 2%, where the strain may be determined by the stress in the stressor layer 140 and the thickness of the stressor layer relative to the channel layer 130. The amount of strain induced in the channel layer 130 may be proportional to the thickness of the stressor layer, where the proportionality of the stress transfer may be directly proportional (i.e., linear). The induced strain may not generate stress induced defects in the channel layer. The induced strain may be elastic strain, and not plastic strain.

In various embodiments, the stressor layer 140 may have a thickness in the in the range of about 5 nm to about 100 nm, in the range of about 20 nm to about 100 nm, or in the range of about 30 nm to about 80 nm, or in the range of about 40 nm to about 60 nm, or in the range of about 5 nm to about 60 nm, or in the range of about 60 nm to about 100 nm, although other thicknesses are contemplated.

In various embodiments, the selection of the material for the stressor layer 140 may depend on the selectivity of the etching process. In various embodiments, the stressor layer is not silicon carbide (SiC) or carbon doped silicon (e.g. Si with about 0.5% to 2% carbon).

Figure 3:
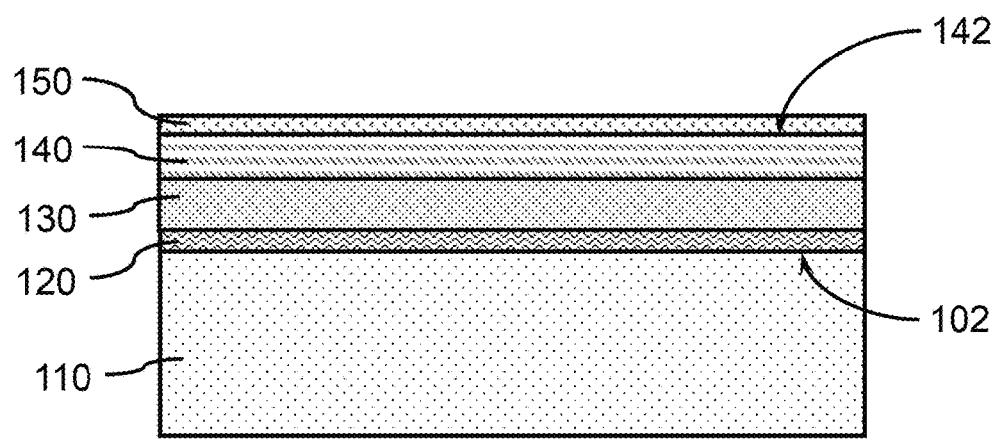
FIG. 3 is a cross-sectional side view showing a softmask layer on the stressor layer, in accordance with the present principles.

FIG. 3 is a cross-sectional side view showing a softmask layer on the stressor layer, in accordance with the present principles.

In one or more embodiments, a softmask layer 150 may be formed on the stressor layer 140, where the softmask layer may be a temporary resist (e.g., polymethyl methacrylate (PMMA)). The softmask layer 150 may be a positive resist or a negative resist. The softmask layer 150 may be formed on the surface 142 of stressor layer 140, for example, by spin coating. The softmask layer 150 may be patterned by a lithography process, as would be known in the art.

Figure 4:
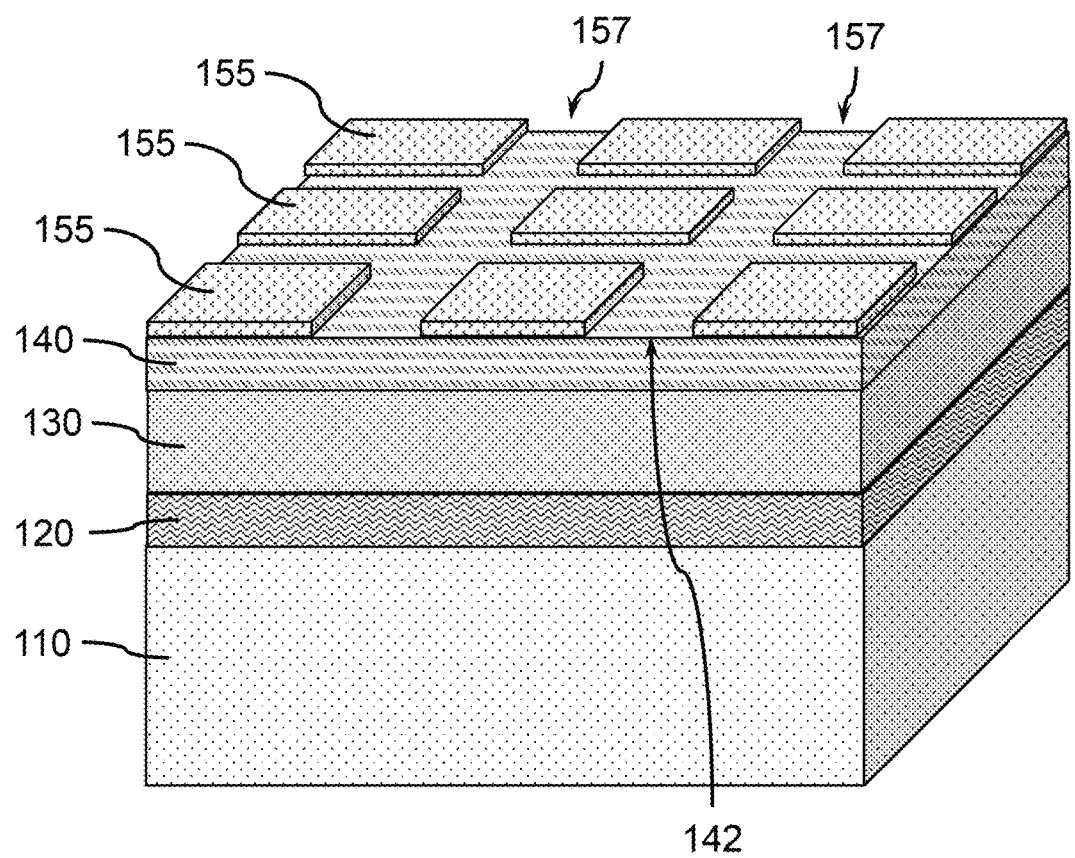
FIG. 4 is a cross-sectional perspective view showing a patterned softmask layer on the stressor layer, in accordance with the present principles.

FIG. 4 is a cross-sectional perspective view showing a patterned softmask layer on the stressor layer, in accordance with the present principles.

The softmask layer 150 may be patterned and developed to form one or more masked regions 155 and one or more exposed regions 157, where a portion of the surface 142 of the stressor layer 140 may be exposed between the one or more masked regions 155.

Figure 5:
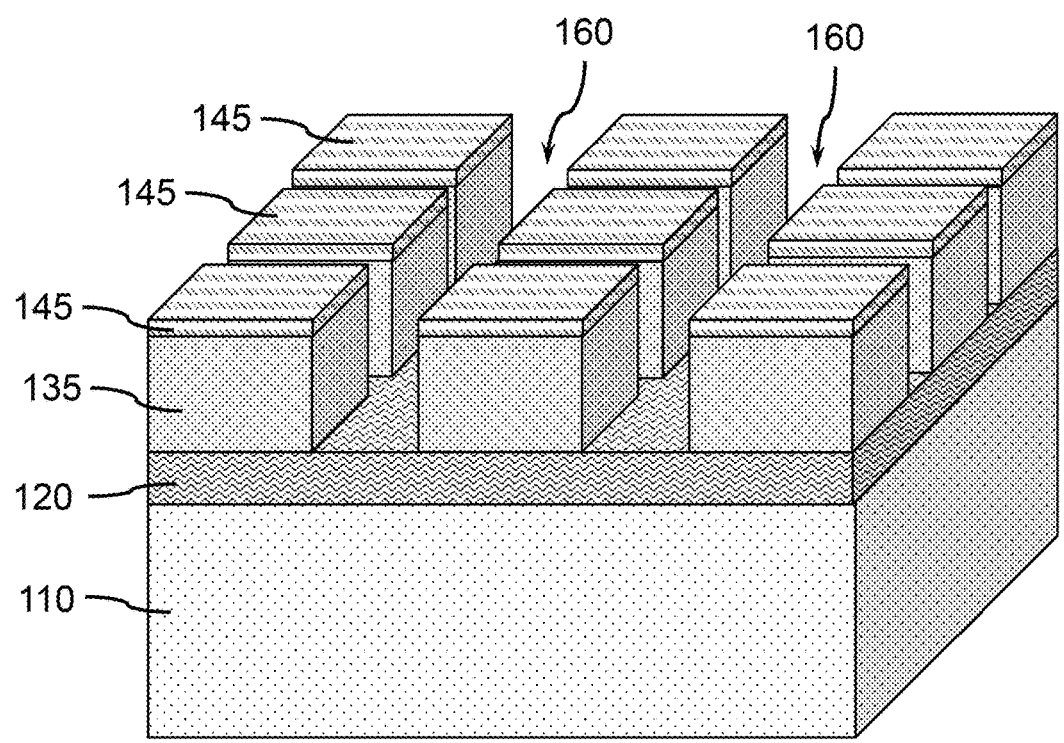
FIG. 5 is a cross-sectional perspective view showing a patterned stressor layer and channel layer on the sacrificial layer after removal of the softmask, in accordance with the present principles.

FIG. 5 is a cross-sectional perspective view showing a patterned stressor layer and channel layer on the sacrificial layer after removal of the softmask, in accordance with the present principles.

In one or more embodiments, the pattern of the masked regions 155 and exposed regions 157 may be transferred to the stressor layer 140 by removing the exposed portion of the stressor layer. The remaining portions of the stressor layer 140 may form one or more stressor islands 145 on the channel layer 130. In various embodiments, an anisotropic etch, for example, a dry plasma etch, may be used to remove the unmasked portions of the stressor layer 140 to form the one or more stressor islands 145. In various embodiments, the stressor layer may be a silicon nitride stressor layer (e.g., $Si_3N_4$), and the dry plasma etch may be a reactive ion etch (RIE) selective for silicon nitride.

In one or more embodiments, a portion of the channel layer 130 may be removed to form one or more channel blocks 135. Exposed portion(s) of the channel layer 130 may be removed by an anisotropic etch, for example, RIE. The stressor islands 145 may act as a hard mask for etching the channel layer 130.

The channel blocks 135 may have a bottom surface in contact with the sacrificial layer surface 122, a top surface in contact with a stressor island 145, where the top surface is opposite the bottom surface and separate by a thickness of the channel layer, and three or more sidewalls extending from the bottom surface to the top surface of the channel block. The stressor islands 145, channel blocks 135, and sacrificial slab(s) 125 may be square or rectangular, although other shapes including, but not limited to triangular, circular, and polygonal are contemplated within the scope of the embodiments.

In various embodiments, the masked regions 155 of the softmask layer 150 may be removed to expose the top surfaces of the one or more stressor islands 145. The masked regions 155 of the softmask layer 150 may be removed by processes known in the art (e.g., ashing, stripping, etc.). In various embodiments, the masked regions 155 may be removed after the stressor islands 145 are formed or after the channel blocks 135 are formed. In various embodiments, the softmask layer 150 may be removed after formation of the one or more etching trenches 160.

Figure 6:
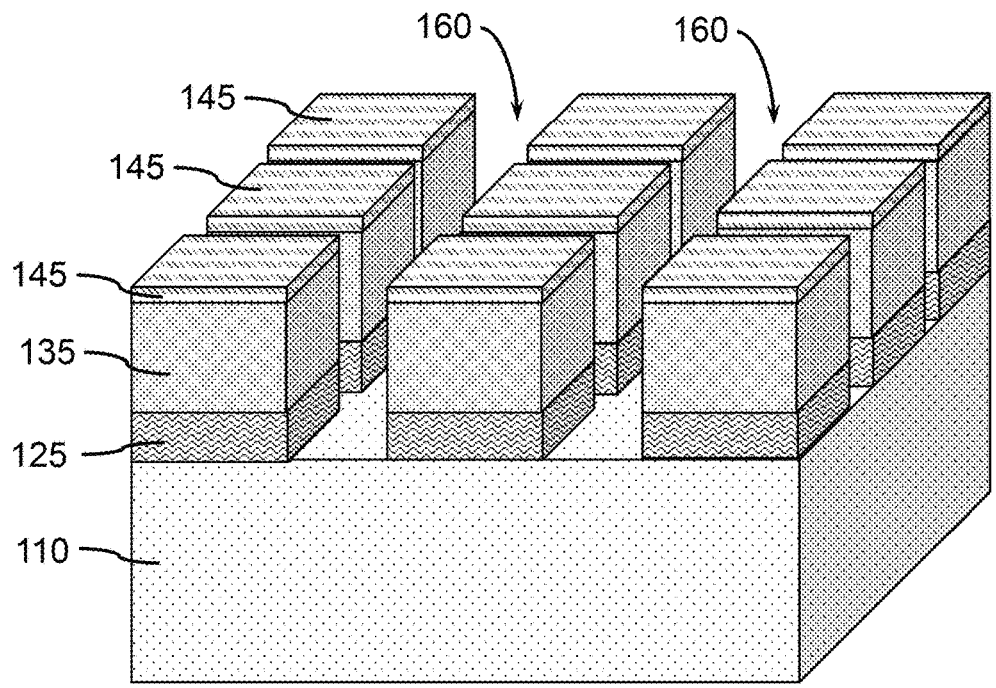
FIG. 6 is a cross-sectional perspective view showing a patterned sacrificial layer on the substrate, in accordance with the present principles.

FIG. 6 is a cross-sectional perspective view showing a patterned sacrificial layer on the substrate, in accordance with the present principles.

In one or more embodiments, a portion of the sacrificial layer 120 may be removed to form one or more sacrificial slab(s) 125. Exposed portion(s) of the sacrificial layer 120 may be removed by an anisotropic etch, for example, RIE. The stressor islands 145 may act as a hard mask for etching the sacrificial layer 120.

In various embodiments, the stressor islands 145, channel blocks 135, and sacrificial slab(s) 125 may have a width in the range of about 250 nm to about 10 µm, or in the range of about 250 nm to about 1 µm, although other widths are contemplated. In various embodiments, the stressor islands 145, channel blocks 135, and sacrificial slab(s) 125 may have a length in the range of about 2 µm to about 100 µm, or in the range of about 2 µm to about 10 µm, or in the range of about 5 µm to about 10 µm, although other lengths are contemplated. In a non-limiting exemplary embodiment, the stressor islands 145, channel blocks 135, and sacrificial slab(s) 125 may be about 1 µm×100 µm, or about 1 µm×10 µm, or about 250 nm×2 µm.

In various embodiments, removal of portions of the stressor layer 140, channel layer 130 and sacrificial layer 120 may form one or more etching trenches 160, where the formation of the etching trench(es) 160 exposes the sidewalls of the stressor layer 140, channel layer 130 and sacrificial layer 120.

Figure 7:
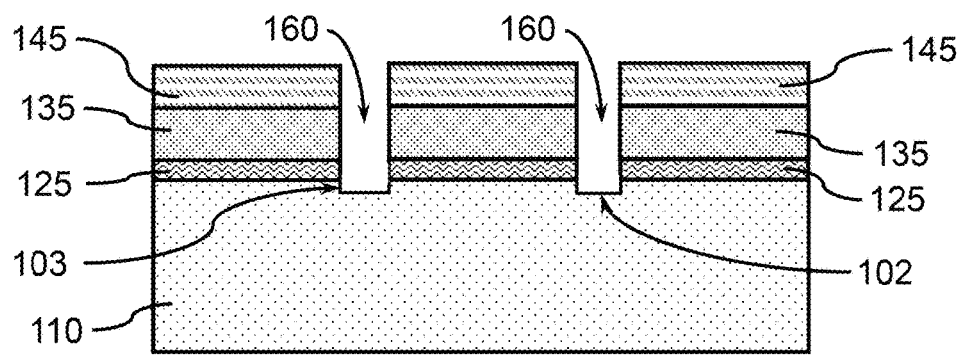
FIG. 7 is a cross-sectional side view showing trenches between a stressor layer on a channel layer and a sacrificial layer between the substrate surface and the channel layer, in accordance with the present principles.

FIG. 7 is a cross-sectional side view showing trenches between stressor islands on channel blocks and sacrificial slabs, in accordance with the present principles.

In one or more embodiments, an etching trench 160 may be formed down to the level of the substrate surface 102 to expose the sidewalls of the one or more sacrificial slab(s) 125. In various embodiments, the etching trench 160 may be formed by a timed RIE, where a portion of the substrate 110 may be removed to form a ledge 103 at the intersection of the sacrificial slab(s) 125 with the substrate. The ledge 103 may be formed in a silicon substrate 110 adjacent to the sidewall of silicon-germanium sacrificial slab(s) 125, where a directional RIE may etch the silicon and silicon-germanium at essentially the same etch rates, so the substrate does not act as an etch stop for forming the etching trench(es) 160.

In one or more embodiments, the etching trench(es) 160 may have a width in the range of about 10 nm to about 150 nm, or in the range of about 25 nm to about 100 nm, or in the range of about 50 nm to about 100 nm. The width of the etching trench(es) 160 may be equal to or greater than the thickness of the sacrificial layer, such that the aspect ratio of trench width to slab thickness is ≥1. In various embodiments, the etching trench width may be from ½ to twice (i.e., 2×) the pitch of the vertical fins intended to be formed from the channel blocks 135. The width of the etching trench(es) 160 may be sufficient to allow a wet etchant to reach the substrate surface 102 and sidewalls of the sacrificial slab(s) 125. In various embodiments, the width of the etching trench 160 may be arbitrarily large.

Figure 8:
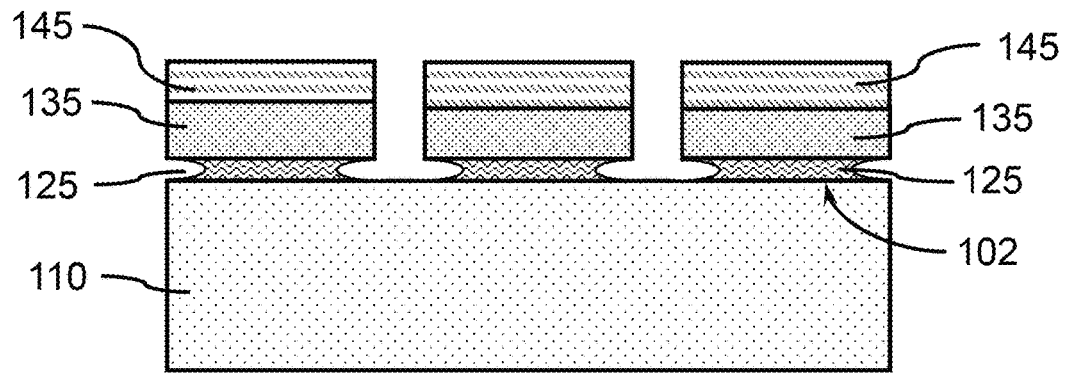
FIG. 8 is a cross-sectional view showing a sidewall etch of the sacrificial slabs, in accordance with the present principles.

FIG. 8 is a cross-sectional view showing a sidewall etch of the sacrificial slabs, in accordance with the present principles.

In one or more embodiments, a gaseous etchant may be used to remove the one or more sacrificial slabs 125, where the gaseous etchant may access the sidewalls of the sacrificial slab(s) 125 through the etching trench(es) 160. In one or more embodiments, a selective, isotropic, gaseous etchant may be gaseous hydrogen chloride (HCl), which may be selective for SiGe.

In a non-limiting exemplary embodiment, an etch using gaseous HCl may be conducted at a temperature in the range of about 600° C. to about 800° C. at a pressure in the range of about 1 Torr to about 100 Torr (e.g., low pressure—long mean-free path) for a duration in the range of about 1 minute to about 150 minutes, where the duration, temperature, and pressure may be selected based on the thickness and lateral dimensions of the material to be removed. The silicon-germanium sacrificial slab(s) 125 may be removed using a hydrogen chloride (HCl) gas, where the HCl may have a 1000:1 selectivity of SiGe to Si. The etch rate and/or etch selectivity may be sensitive to the temperature of the etching process, the germanium concentration of SiGe sacrificial slabs 125, and the inclusion of dopants in the sacrificial slabs 125.

In one or more embodiments, an isotropic wet etch may be used to remove the one or more sacrificial slabs 125, where the wet etchant may access the sidewalls of the sacrificial slab(s) 125 through the etching trench(es) 160. In one or more embodiments, the isotropic wet etchant may be a solution of hydrofluoric acid (HF), peroxide ($H_2O_2$) and acetic acid ($CH_3COOH$). In a non-limiting exemplary embodiment, the isotropic wet etchant may be a solution made up of 16.7% of 6% HF, 33.3% of $H_2O_2$, and 50% of 99.8% $CH_3COOH$.

Figure 9:
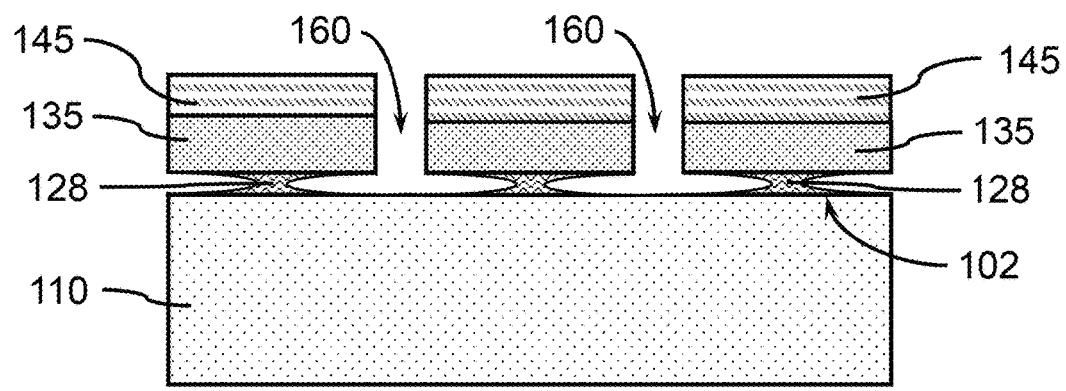
FIG. 9 is a cross-sectional view showing a plurality of the channel blocks undercut by the selective etching of the sacrificial slabs to form pillars, in accordance with the present principles.

FIG. 9 is a cross-sectional view showing a plurality of the channel blocks undercut by the selective etching of the sacrificial slabs, in accordance with the present principles.

In one or more embodiments, the channel blocks 135 may be undercut by removing the sacrificial slabs 125, where the etchant selectively etches the material of the sacrificial slabs 125 without damaging the channel blocks. A channel block 135 may be temporarily anchored to the substrate surface by a residual pillar 128 of the sacrificial slab 125 before being completely separated. The residual pillar 128 may maintain the channel block 135 in a fix position on the substrate 110 until the entire sacrificial slab 125 has been removed.

In a non-limiting exemplary embodiment, the residual pillar(s) 128 may be silicon-germanium pillar(s) formed by removing a portion of a silicon-germanium sacrificial slab(s) 125, where the residual pillar(s) 128 may have a thickness (i.e., height) equal to the initial thickness of the sacrificial slab(s) 125. The residual pillar(s) 128 may have lateral dimensions (i.e., width, length, diameter) less than the initial width and length of the sacrificial slab(s) 125. In various embodiments, the residual pillar(s) 128 may have lateral dimensions less than 75%, or less than 50%, or less than 25%, or less than 10% of the initial lateral dimensions of the sacrificial slab(s) 125.

In various embodiments, the corners of the channel blocks 135 may bend towards the surface of the 102 of the substrate 110 as the underlying sacrificial slab 125 is etched away. In various embodiments, one or more corners of the channel block 135 may come into physical contact with the surface of the substrate 110, where the amount of bending and contact may depend on the thickness of the channel block 135, the thickness of the stressor island 145 on the channel block, the stress in the stressor island, and the distance from the corner of the channel block to the surface 102 of the substrate (i.e., thickness of the underlying sacrificial slab 125). The corners of the channel block 135 that come into contact with the substrate surface may form physical bonds with the surface that further anchor the channel block 135 in place as the sacrificial slab 125 is removed. The combination of the pillars and the bending that bonds the channel blocks in place may prevent the channel blocks 135 from floating away when the residual pillar(s) 128 have been completely removed.

Figure 10:
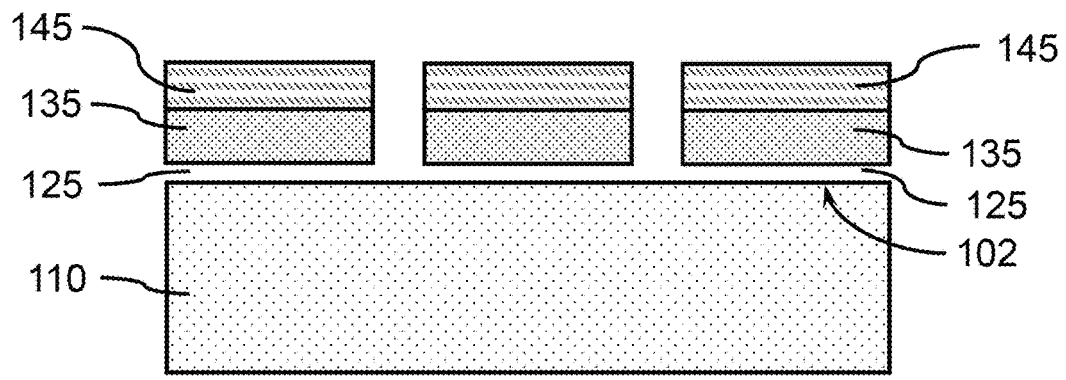
FIG. 10 is a cross-sectional view showing a plurality of the channel blocks undercut by the selective etching of the sacrificial slabs, in accordance with the present principles.

FIG. 10 is a cross-sectional view showing a plurality of the channel blocks undercut by the selective etching of the sacrificial slabs, in accordance with the present principles.

In one or more embodiments, the sacrificial slabs 125 are completely removed to release the one or more channels block 135 from the substrate 110. The channel blocks 135 may temporarily be separated from the substrate surface 102 by a layer of a wet etchant.

In one or more embodiments, the one or more channels block 135 and the substrate 110 have hydrophobic surfaces, and may experience a hydrophobic attraction, so the released channel blocks do not float away in the etchant. The channels block(s) 135 may be held in position by a differential hydrostatic pressure due to the hydrophobic surface interactions that prevents the channel block(s) from floating away. In various embodiments, the bottom surface of a channel block 135 attaches to the surface 102 of the substrate by van der Waals forces.

In various embodiments, the stress imposed by a stressor island 145 on the surface of the channel block 135 in contact with the stressor island 145 can generate a resulting strain in the channel block 135. In various embodiments, the stressor island 145 may exert a tensile stress or a compressive stress that may impart a compressive strain or a tensile strain in the channel block 135.

While not intending to be bound by theory, it is believed that separation of the channel block 135 from the sacrificial slab allows the crystal structure of the channel block to realign itself under the stress of the stressor layer. When the channel block 135 is in contact with the sacrificial slab 125, the sacrificial slab can maintain the lattice structure of the channel block in essentially an equilibrium arrangement. When the sacrificial slab 125 is removed and channel block 135 is released from the sacrificial slab 125, the stressor island 145 is free to induce a strain on the channel block 135 without the counter restoring force from the sacrificial slab

125. The channel block 135 may then conform to the stressor layer, and the resulting imparted strain. Because the strain in the channel block(s) 135 is induced from a top surface instead of from the sides, no lateral feature, which may increase the lateral size and/or spacing, is needed.

In one or more embodiments, the channel blocks may have an induced strain in the range of about 0.5% to about 2%.

Figure 11:
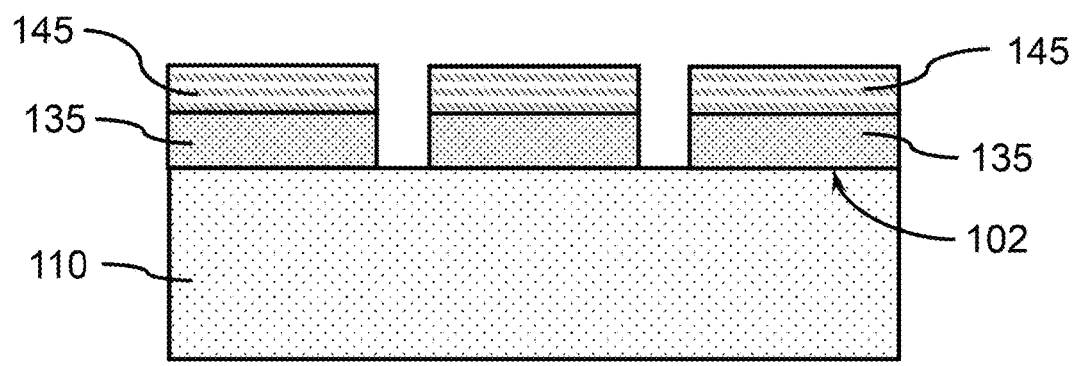
FIG. 11 is a cross-sectional side view showing the channel blocks and stressor islands attached to the substrate, in accordance with the present principles.

FIG. 11 is a cross-sectional side view showing the stressor islands on channel blocks that are attached to the substrate, in accordance with the present principles.

The channel blocks 135 may initially be attached to the substrate surface 102 by van der Walls forces that provide weak bonding between the channel blocks 135 and the substrate surface 102. In various embodiments, the stressor islands 145, channel blocks 135, and substrate 110 may be heat treated to convert the weak van der Waals attachment into strong covalent bonds between the channel blocks 135 and the substrate surface 102.

In one or more embodiments, the heat treatment may be an anneal at a temperature in the range of about 300° C. to about 750° C., or in the range of about 400° C. to about 700° C., or in the range of about 500° C. to about 600° C. In various embodiments, the temperature of the heat treatment is below the temperature at which the stress/strain would be fully relaxed by the annealing.

In one or more embodiments, the heat treatment may be conducted for a time period in the range of about 1 hour to about 18 hours, or in the range of about 2 hours to about 12 hours, or in the range of about 4 hours to about 10 hours, or in the range of about 6 hours to about 8 hours. The duration of the heat treatment may depend on the temperature of the heat treatment, where the temperature and duration of the heat treatment may be predetermined and adjusted to apply the same thermal budget to the channel blocks 135 and the substrate 110. In a non-limiting exemplary embodiment, the heat treatment may be an anneal conducted at a temperature in the range of about 500° C. to about 600° C. for a duration in the range of about 4 hours to about 10 hours in an annealing furnace.

In various embodiments, the heat treatment may be a rapid thermal anneal at a temperature in the range of about 700° C. to about 1100° C., or in the range of about 800° C. to about 1000° C., for a time period in the range of about 1 second to about 120 minutes, or in the range of about 10 seconds to about 60 minutes, or in the range of about 10 seconds to about 60 seconds, or in the range of about 10 seconds to about 30 seconds. The duration and temperature may be adjusted such that the heat treatment may be conducted at a higher temperature for a shorter period of time.

Figure 12:
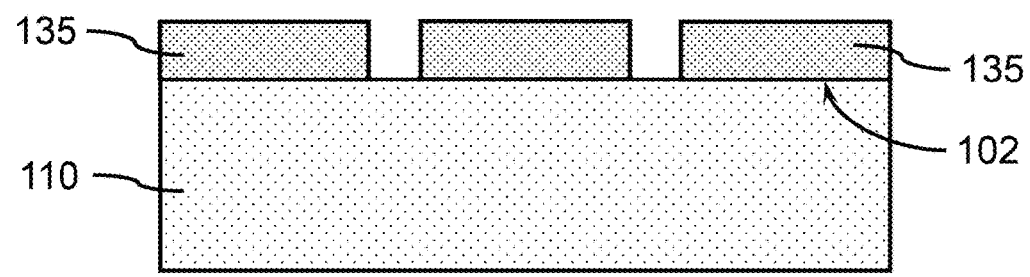
FIG. 12 is a cross-sectional side view showing the channel blocks bonded to the substrate, in accordance with the present principles.

FIG. 12 is a cross-sectional side view showing the channel blocks bonded to the substrate, in accordance with the present principles.

In one or more embodiments, the stressor islands 145 may be removed from the top surfaces of the channel blocks after the stressor islands 145, channel blocks 135, and substrate 110 have been heat treated. The stressor islands 145 may be removed by a selective dry or wet etch that leaves the channel blocks 135 intact. The stressor islands 145 may be removed after the strain is locked into the channel blocks 135, which may be after the channel blocks 135 are covalently bonded to the substrate 110. In various embodiments, the heat treatment does not reduce the strain in the channel block(s) 135.

Figure 13:
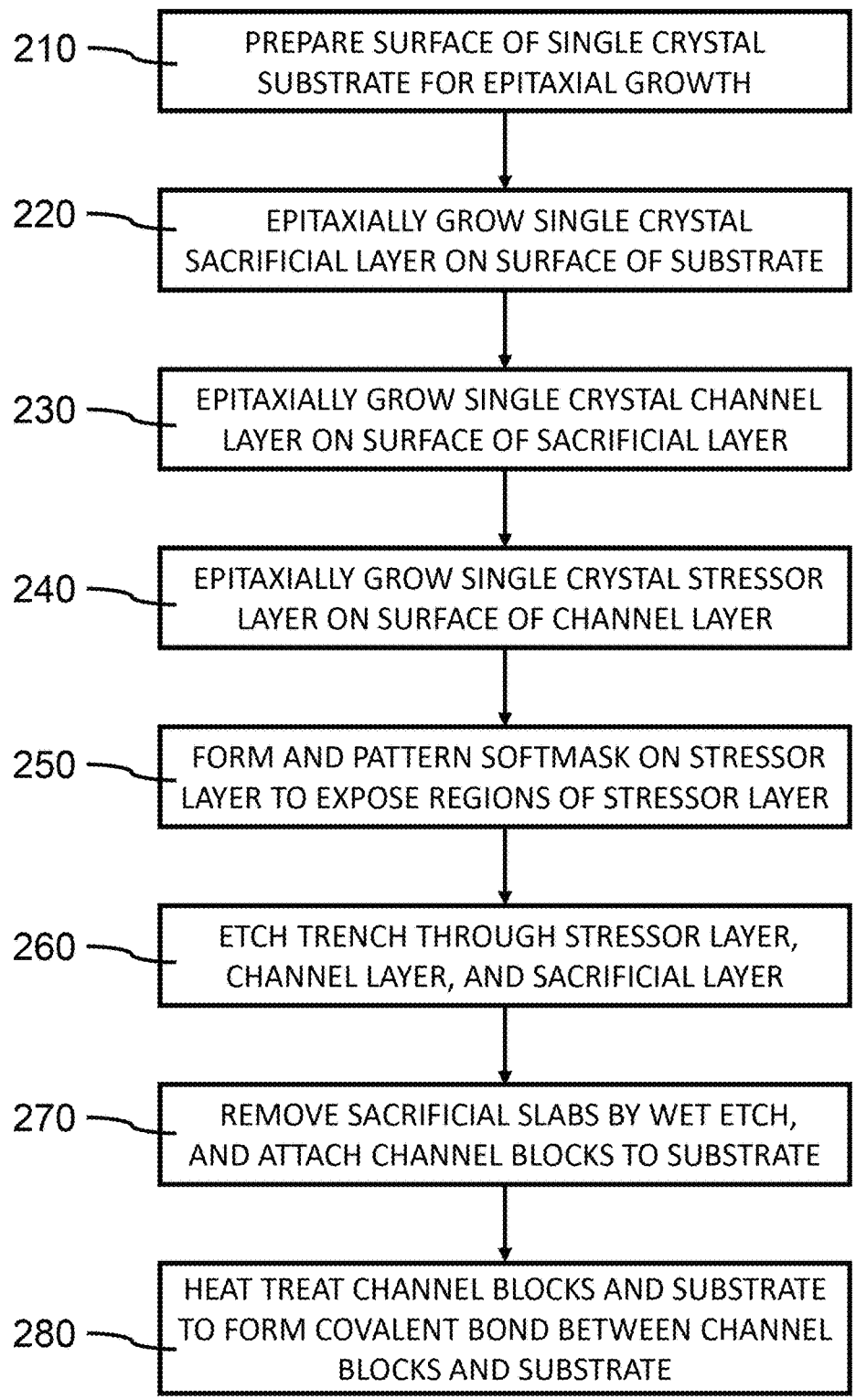
FIG. 13 is a block/flow chart of an exemplary embodiment of a method for the fabrication of a strained channel without the consumption of a SeOI wafer, in accordance with the present principles.

FIG. 13 is a block/flow chart of an exemplary embodiment of a method for the fabrication of a strained channel without the consumption of a SeOI wafer, in accordance with the present principles.

In block 210, a surface of a substrate is prepared for the epitaxial growth of a subsequent layer. A substrate surface may be prepared by heat treatment (e.g., annealing, vaporization of surface oxides, etc.), polishing to provide a flat, uniform surface (e.g., chemical mechanical polishing (CMP)), low energy ion sputtering, etc., as well as combinations thereof.

In block 220, a single crystal sacrificial layer is grown on the prepared surface of the substrate, where the surface may have a single crystal structure (e.g., silicon <100>). The growth is an epitaxial growth where the sacrificial layer has the same crystal structure as the substrate surface. In a non-limiting example, a SiGe sacrificial layer is grown on a single crystal silicon surface without strain and with the same lattice constant and orientation as the single crystal silicon surface. The single crystal sacrificial layer may be formed by MBE or epitaxial CVD to a thickness of 10 nm to 100 nm.

In block 230, a channel layer is grown on the single crystal surface of the sacrificial layer, where the channel layer has a single crystal structure. The growth is an epitaxial growth, where the channel layer has the same crystal structure and orientation as the sacrificial layer surface. In a non-limiting example, a silicon channel layer is epitaxially grown on the single crystal SiGe sacrificial layer without strain and with the same lattice constant and orientation as the single crystal silicon surface.

In block 240, a stressor layer is grown on the single crystal surface of the channel layer, where the stressor layer has a non-crystalline (e.g., microcrystalline, amorphous, etc.) structure. In a non-limiting example, an amorphous silicon nitride (e.g., $Si_3N_4$) stressor layer is formed on the single crystal Si channel layer. The stressor layer has an inherent internal stress that can induce a strain in the single crystal channel layer.

In block 250, a softmask is formed on the stressor layer, for example, by spin-coating a PMMA film on the stressor layer. The softmask may be patterned and developed by lithographic methods to form one or more masked regions and one or more exposed regions.

In block 260, a trench may be formed in the stressor layer, channel layer, and sacrificial layer. An anisotropic etch may be used to form the trenches in the exposed regions between the masked regions. A sequence of selective dry plasma etching may be used to remove the material of each layer, where the substrate surface may act as an etch stop for the etching of the sacrificial layer. Forming the trenches segregates the stressor layer, channel layer, and sacrificial layer into separate stressor islands, channel blocks and sacrificial layer slabs, where the trenches extend through each of the layers to the substrate surface. In a non-limiting example, a timed RIE may be used to form the trenches.

Due to some lack of etch selectivity, there can be a ledge created in the substrate when the trenches are formed and/or the sacrificial slabs are removed. Subsequent processing can further pattern the channel blocks, and can also further define and etch this ledge. The ledge may still leave evidence after, for example, a fin-forming RIE, as a ledge deeper in the substrate away from fin edges.

In block 270, the sacrificial slabs may be etched away using an isotropic wet etch or an isotropic gaseous etch selective for the material of the sacrificial layer/slabs. In a non-limiting example, the etchant is a solution of HF, peroxide, and acetic acid, or gaseous hydrogen chloride (HCl), to selectively etch silicon-germanium sacrificial slab(s). The channel block can remain anchored to the substrate surface through a pillar of the sacrificial material until the entire underlying sacrificial slab is etched away.

In one or more embodiments, the stressor island(s) may apply a stress in the range of about +1.6 GPa to about −3 GPa, which may induce a strain in the range of about 0.5% to about 2% in the channel block(s).

The blocks of single-crystal strained silicon in direct contact with the unstrained bulk silicon substrate may not be coherent with the crystal structure of the silicon substrate surface. There can be a distinct, planar interface where the strained Si channel block(s) and the substrate surface are in contact, such that the crystal lattice across the interface of the substrate to surface 102 to the channel blocks 135 are not continuous, which may be detected by x-ray crystallography as being distinct on opposite sides of the interface. The strained Si channel block(s) can also have a small (i.e., ≤0.5°) random twist misalignment with the crystal structure/orientation of the substrate surface.

The hydrophobic aspect of the channel block surfaces and the substrate surfaces may cause a migration of the released channel block(s) to the substrate surface, where the channel blocks can physically bonded to the substrate surface through van der Walls forces. In a non-limiting example, single crystal silicon channel blocks physically adhere to the single crystal substrate surface.

In block 280, the channel block(s), stressor island(s), and substrate are heat treated to convert the physical bonding between the channel blocks and substrate surface to a chemical (e.g., covalent) bond. The heat treatment may be an anneal for a suitable time and duration to form the chemical bond between the channel block(s) and substrate. In a non-limiting example, the silicon nitride stressor island(s), silicon channel block(s), and silicon substrate is annealed at about 400° C. for about 6 hours. The annealing process does not relieve the strain in the channel block(s). Instead, forming the chemical bonds to the substrate surface locks the channel blocks into the strained state.

After annealing and bonding the channel blocks(s) to the substrate surface, the stressor island(s) may be selectively be removed.

This method may be used with various technology nodes, because the strain in the channel block(s) is induced from a top surface instead of from the sidewalls, so no lateral feature(s) are needed as the stressor(s).

In various embodiments, the bonded channel blocks may be further processed by forming an organic planarization layer (OPL) on the channel blocks 135 bonded to the substrate 110, where the OPL may fill in the etching trenches between the channel blocks 135. A chemical-mechanical polishing (CMP) may be used to remove a portion of the OPL to provide a flat, uniform surface for subsequent processing to form the finFET and/or MOSFET devices, including forming source/drains, gate structures, and electrical contacts. The FinFETs may be configured for vertical or horizontal current flow.

The strained channel blocks may be further processed, for example, by a sidewall image transfer (SIT) process to convert the channel blocks into one or more vertical fins, or the channel blocks may be processed to form planar channel regions for horizontal MOSFETs on the substrate. The lithographic steps to mask and pattern the channel blocks may be conducted by alignment with the positions of the channel blocks on the substrate. A gate structure may be formed on the vertical fin(s) or channel region(s) to form one or more finFET or MOSFET devices on the substrate.

It is to be understood that the present invention is described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed herein could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Having described preferred embodiments of a method and device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a strained channel for a field effect transistor, comprising:
    forming a sacrificial layer on a substrate;
    forming a channel layer on the sacrificial layer;
    forming a stressor layer on the channel layer, wherein the stressor layer applies a stress to the channel layer;
    forming at least one etching trench by removing at least a portion of the stressor layer, channel layer, and sacrificial layer, wherein the etching trench exposes at least a portion of a sidewall of the sacrificial layer, and separates the stressor layer, channel layer, and sacrificial layer into two or more stressor islands, channel blocks, and sacrificial slabs; and
    removing the sacrificial slabs to release the channel blocks from the substrate using a selective etch, wherein the channel blocks adhere to the substrate surface.

2. The method of claim 1, wherein the sacrificial layer is silicon-germanium (SiGe).

3. The method of claim 1, wherein the stressor layer is silicon nitride (SiN).

4. The method of claim 1, wherein the substrate surface has a single crystal structure, and the sacrificial layer is a single crystal layer formed on the substrate surface by a heteroepitaxial growth process.

5. The method of claim 1, wherein the channel layer is a single crystal silicon formed on the sacrificial layer by a heteroepitaxial growth process.

6. The method of claim 1, wherein the selective etch uses gaseous hydrogen chloride (HCl).

7. The method of claim 1, wherein the channel layer has a thickness in the range of about 5 nm to about 100 nm, and the stressor layer is at least as thick as the channel layer.

8. The method of claim 1, wherein the sacrificial layer has a thickness in the range of about 10 nm to about 100 nm.

9. The method of claim 1, further comprising heat treating the channel blocks and substrate to chemically bond the channel blocks to the substrate surface.

10. The method of claim 9, wherein the heat treating is conducted at a temperature in the range of about 300° C. to about 750° C. for a duration in the range of about 1 hour to about 18 hours.

11. A method of forming a strained channel, comprising:
    forming a single crystal silicon-germanium sacrificial layer on a single crystal substrate surface;
    forming a single crystal silicon channel layer on the single crystal silicon-germanium sacrificial layer;
    forming a silicon nitride stressor layer on the single crystal silicon channel layer, wherein the silicon nitride stressor layer has a tensile or compressive stress;
    forming at least one etching trench by removing at least a portion of the silicon nitride stressor layer, single crystal silicon channel layer, and single crystal silicon-germanium sacrificial layer, wherein the etching trench exposes at least a portion of a sidewall of the single crystal silicon-germanium sacrificial layer, and separates the silicon nitride stressor layer, single crystal silicon channel layer, and single crystal silicon-germanium sacrificial layer into two or more silicon nitride stressor islands, single crystal silicon channel blocks, and single crystal silicon-germanium sacrificial slabs; and removing the single crystal silicon-germanium sacrificial slabs to release the single crystal silicon channel blocks from the substrate using a selective etch, wherein the single crystal silicon channel blocks adhere to the single crystal substrate surface.

12. The method of claim 11, wherein the single crystal silicon channel layer has a thickness in the range of about 5 nm to about 100 nm, and the silicon nitride stressor layer has a thickness in the range of about 5 nm to about 100 nm, where the stressor layer is at least as thick as the channel layer.

13. The method of claim 11, wherein the etching trench has a width equal to or greater than the thickness of the silicon-germanium sacrificial layer.

14. The method of claim 11, wherein the single crystal substrate surface is a <100> surface of a single crystal silicon substrate.

15. The method of claim 11, wherein the selective etch uses a solution made of a hydrofluoric acid (HF) solution, a hydrogen peroxide ($H_2O_2$) solution, and acetic acid ($CH_3COOH$).

16. An intermediate channel structure, comprising;
a substrate with a single crystal surface;
one or more silicon-germanium pillars, wherein each of the one or more silicon-germanium pillars supports a silicon channel block, and wherein the silicon channel block has a width in the range of about 250 nm to about 10 μm, and a length in the range of about 2 μm to about 100 μm; and
a silicon nitride stressor island on each silicon channel block, wherein the stressor island applies a stress to a top surface of the silicon channel block.

17. The intermediate device structure of claim 16, wherein the stressor island applies a tensile stress to a top surface of the silicon channel block in the range of about +1.6 GPa to about −3 GPa.

18. The intermediate device structure of claim 16, wherein the substrate is a single crystal silicon wafer.

19. The intermediate device structure of claim 18, wherein the silicon channel blocks are separated by an etching trench have a width in the range of about 10 nm to about 150 nm, where the width of the etching trench is equal to or greater than the thickness of the silicon-germanium pillars.

* * * * *